(12) United States Patent
Son et al.

(10) Patent No.: US 12,727,245 B2
(45) Date of Patent: Sep. 1, 2026

(54) DISPLAY DEVICE AND MANUFACTURING METHOD THEREOF

(71) Applicant: Samsung Display Co., Ltd., Yongin-Si (KR)

(72) Inventors: Kyoung Seok Son, Seoul (KR); Myoung Hwa Kim, Seoul (KR); Jay Bum Kim, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 463 days.

(21) Appl. No.: 18/135,550

(22) Filed: Apr. 17, 2023

(65) Prior Publication Data

US 2023/0255077 A1 Aug. 10, 2023

Related U.S. Application Data

(60) Continuation of application No. 17/344,860, filed on Jun. 10, 2021, now Pat. No. 11,653,541, which is a (Continued)

(30) Foreign Application Priority Data

Oct. 23, 2018 (KR) ........................ 10-2018-0126706

(51) Int. Cl.

*H10D 86/40* (2025.01)
*G09G 3/3258* (2016.01)

(Continued)

(52) U.S. Cl.

CPC ......... *H10D 86/423* (2025.01); *G09G 3/3258* (2013.01); *G09G 3/3291* (2013.01);

(Continued)

(58) Field of Classification Search

CPC ............. H10K 59/121; H10K 59/1213; H10K 59/1216

See application file for complete search history.

(56) References Cited

U.S. PATENT DOCUMENTS

| | | | |
|---|---|---|---|
| 9,129,927 | B2 | 9/2015 | Gupta et al. |
| 11,871,596 | B2 | 1/2024 | Kim et al. |

(Continued)

FOREIGN PATENT DOCUMENTS

| | | | |
|---|---|---|---|
| JP | 2018-031976 | A | 3/2018 |
| KR | 10-2015-0007742 | A | 1/2015 |

(Continued)

OTHER PUBLICATIONS

Korean Notice of Allowance corresponding to Application No. 10-2018-0126706 and issued on Jun. 27, 2024, 7 pages.

*Primary Examiner* — Christopher A Johnson
(74) *Attorney, Agent, or Firm* — Innovation Counsel LLP

(57) ABSTRACT

A display device includes a substrate and a pixel disposed on the substrate. The pixel includes a first transistor, a second transistor electrically connected to the first transistor, a third transistor electrically connected to the first transistor, and a light-emitting diode element electrically connected to at least one of the first transistor and the third transistor. The first transistor includes a first semiconductor member and a first gate electrode. The first semiconductor member includes an oxide semiconductor material. The first gate electrode is disposed between the first semiconductor member and the substrate. The second transistor includes a second semiconductor member and a second gate electrode. The second semiconductor member includes the oxide semiconductor material. The second semiconductor member is disposed between the second gate electrode and the substrate. The third transistor includes a third semiconductor member including silicon.

17 Claims, 19 Drawing Sheets

Related U.S. Application Data division of application No. 16/562,384, filed on Sep. 5, 2019, now Pat. No. 11,114,521.

(51) Int. Cl.

*G09G 3/3291* (2016.01)
*H10K 59/124* (2023.01)
*H10K 59/131* (2023.01)
*H10K 59/12* (2023.01)

(52) U.S. Cl.

CPC ....... *H10K 59/124* (2023.02); *H10K 59/1315* (2023.02); *H10K 59/1201* (2023.02)

(56) References Cited

U.S. PATENT DOCUMENTS 11,876,099 B2 1/2024 Osawa et al.
2015/0222889 A1* 8/2015 Kim .................... H04N 13/398 345/215
2015/0243203 A1 8/2015 Kim et al.
2017/0125452 A1 5/2017 Ide et al.
2017/0193919 A1 7/2017 Hwang et al.
2017/0294497 A1 10/2017 Lius et al.
2018/0061857 A1 3/2018 Kanda et al.
2018/0062105 A1* 3/2018 Lius .................. H10K 59/1216
2018/0158843 A1 6/2018 Lius et al.
2018/0197474 A1 7/2018 Jeon et al.
2018/0277614 A1 9/2018 Ono et al.
2019/0305064 A1* 10/2019 Kuniyoshi ........... H10K 59/131

FOREIGN PATENT DOCUMENTS

KR 10-2015-0100515 A 9/2015
KR 10-2016-0002584 A 1/2016
KR 10-2016-0018825 A 2/2016
KR 10-2017-0044167 A 4/2017
KR 10-2018-0026610 A 3/2018
KR 10-2018-0077954 A 7/2018

* cited by examiner

DISPLAY DEVICE AND MANUFACTURING METHOD THEREOF

CROSS-REFERENCE(S) TO RELATED APPLICATION

This application is a continuation application of U.S. patent application Ser. No. 17/344,860 filed on Jun. 10, 2021, which is a divisional application of U.S. patent application Ser. No. 16/562,384 filed Sep. 5, 2019 (now U.S. Pat. No. 11,114,521), which claims priority to and the benefit of Korean Patent Application No. 10-2018-0126706 filed in the Korean Intellectual Property Office on Oct. 23, 2018; the entire contents of the Korean Patent Application are incorporated herein by reference.

BACKGROUND

(A) Technical Field

This technical field relates to a display device and a manufacturing method of the display device.

(b) Description of the Related Art

An organic light emitting diode (OLED) display device may include pixels for displaying an image. Each of the pixels may include an OLED. An OLED typically includes a cathode, an anode, and an emission layer disposed between the two electrodes. Electrons injected from the cathode and holes injected from the anode may combine in the emission layer to form excitons for emitting light. Each pixel of the OLED display device may include transistors and a capacitor for driving the corresponding OLED.

The above information disclosed in this Background section is for enhancement of understanding of the background of this application. This Background section may contain information that does not form the prior art that is already known in this country to a person of ordinary skill in the art.

SUMMARY

Embodiments may be related to a display device and a manufacturing method of the display device. The display device may include transistors having predetermined characteristics.

An embodiment may be related to a display device. The display device may include a substrate and a pixel disposed on the substrate. The pixel may include a first transistor, a second transistor electrically connected to the first transistor, a third transistor electrically connected to the first transistor, and a light-emitting diode element electrically connected to at least one of the first transistor and the third transistor. The first transistor may include a first semiconductor member and a first gate electrode. The first gate electrode may be disposed between the first semiconductor member and the substrate. The second transistor may include a second semiconductor member and a second gate electrode. The second semiconductor member may be disposed between the second gate electrode and the substrate. An oxide semiconductor material of the second semiconductor member may be identical to an oxide semiconductor material of the first semiconductor member. The third transistor may include a third semiconductor member including silicon.

The display device may include the following element: a data line configured to transmit a data signal; and an emission control line configured to transmit an emission control signal. The first transistor may be electrically connected to the light-emitting diode element. The second transistor may be electrically connected to the data line. The third transistor may be electrically connected to the emission control line.

The display device may include a first insulator. The first transistor includes a first source electrode and a first drain electrode both disposed on the first semiconductor member. A first face of the first source electrode may be disposed between the first semiconductor member and a second face of the first source electrode. The first face of the first drain electrode may be disposed between the first semiconductor member and a second face of the first drain electrode. A first face of the second gate may be disposed between the substrate and a second face of the second gate electrode. Each of the second face of the first source electrode, the second face of the first drain electrode, and the second face of the second gate electrode may directly contact the first insulator.

The light-emitting diode element may be electrically connected to the first drain electrode.

The display device may include the following elements: a first insulating layer disposed on the substrate; a second insulating layer disposed on the first insulating layer; and a third insulating layer disposed on the second insulating layer. The third transistor includes a third gate electrode. The third semiconductor member may be disposed between the substrate and the first insulating layer. The third gate electrode may be disposed between the first insulating layer and the second insulating layer. A first face of the first semiconductor member may be disposed between the substrate and a second face of the first semiconductor member. A first face of the second semiconductor member may be disposed between the substrate and a second face of the second semiconductor member. Each of the first face of the first semiconductor member and the first face of the second semiconductor member may directly contact the third insulating layer.

The first source electrode, the first drain electrode, and the second gate electrode may be disposed between the third insulating layer and the first insulator.

The display device may include the following elements: a connecting member connected to the drain electrode of the first transistor through a contact hole formed in the first insulator; and a second insulator disposed on the connecting member. An electrode of the light-emitting diode element may be connected to the connecting member through a contact hole formed in the second insulator.

The display device may include a light blocking layer overlapping the second semiconductor member and disposed between the substrate and the second semiconductor member.

The display device may include a driving voltage line configured to transmit a driving voltage. At least one of the first transistor and the third transistor may be electrically connected to the driving voltage line.

The pixel may include a storage capacitor electrically connected between the first gate electrode and the light-emitting diode element.

The pixel may include a fourth transistor electrically connected to the first transistor. The fourth transistor may include a fourth semiconductor member and a fourth gate electrode. An oxide semiconductor material of the fourth semiconductor member may be identical to the oxide semiconductor material of the first semiconductor member. The fourth semiconductor member may be disposed between the substrate and the fourth gate electrode.

The pixel may include a voltage-maintaining capacitor. The voltage-maintaining capacitor and the light-emitting diode element may be electrically connected in parallel between a first voltage supply and a second voltage supply.

The first transistor may be electrically connected between the light-emitting diode element and the third transistor.

The light-emitting diode element may be electrically connected to the third transistor.

An embodiment may be related to a method for manufacturing a display device. The display device may include a pixel. The pixel may include a first transistor, a second transistor, a third transistor, and a light-emitting diode element. The method may include the following steps: forming a semiconductor member of the third transistor; forming a first insulating layer on the semiconductor member of the third transistor; forming a gate electrode of the third transistor on the first insulating layer; forming a second insulating layer on the gate electrode of the third transistor; forming a gate electrode of the first transistor on the second insulating layer; forming a third insulating layer on the gate electrode of the first transistor; forming a semiconductor member of the first transistor and a semiconductor member of the second transistor on the third insulating layer; and forming a source electrode of the first transistor and a drain electrode of the first transistor on the semiconductor member of the first transistor when forming a gate electrode of the second transistor on the semiconductor member of the second transistor.

The first semiconductor member and the second semiconductor member both include an oxide semiconductor material. The third semiconductor member includes polysilicon.

The method may include the following steps: forming a fourth insulating layer on the source electrode of the first transistor, the drain electrode of the first transistor, and the gate electrode of the second transistor; forming a connecting member on the fourth insulating layer, the connecting member being connected to the drain electrode of the first transistor through a contact hole of the fourth insulating layer; forming a fifth insulating layer on the connecting member; and forming an electrode of the light-emitting diode element on the fifth insulating layer, the electrode of the light-emitting diode element being connected to the connecting member through a contact hole of the fifth insulating layer.

The semiconductor member of the second transistor may include a source electrode of the second transistor and a drain electrode of the second transistor. The semiconductor member of the third transistor may include a source electrode of the third transistor and a drain electrode of the third transistor. A contact hole exposing the source electrode of the second transistor or the drain electrode of the second transistor may be formed in the fourth insulating layer after a contact hole exposing the source electrode of the third transistor or the drain electrode of the third transistor has been formed in the fourth insulating layer, the third insulating layer, the second insulating layer, and the first insulating layer.

The method may include forming an insulator on the semiconductor member of the second transistor before forming the source electrode of the first transistor, the drain electrode of the first transistor, and the gate electrode of the second transistor and after forming the semiconductor member of the first transistor and the semiconductor member of the second transistor. The gate electrode of the second transistor may overlap the insulator.

The first transistor may be a driving transistor. The second transistor may be a switching transistor. The third transistor may be an emission control transistor. The first transistor may be electrically connected to each of the second transistor and the third transistor. The light-emitting diode element may be connected to at least one of the first transistor and the third transistor.

An embodiment may be related to a display device. The display device may include a substrate and a pixel disposed on the substrate. The pixel may include the following elements: a first transistor including a first gate electrode and a first semiconductor member, the first gate electrode being disposed between the substrate and the first semiconductor member, the first semiconductor member including an oxide material; a second transistor electrically connected to the first transistor, including a second gate electrode, and including a second semiconductor member, the second semiconductor member being disposed between the substrate and the second gate electrode, the second semiconductor member including the oxide material; a third transistor electrically connected to the first transistor and including a third semiconductor member, the third semiconductor member including silicon; and a light-emitting diode element electrically connected to at least one of the first transistor and the third transistor.

The first transistor may be a driving transistor. The second transistor may be a switching transistor. The third transistor may be an emission control transistor.

The third transistor may include a third gate electrode. The third semiconductor may be disposed between the substrate and the third gate electrode.

The display device may include a first insulator. The first transistor may include a first source electrode and a first drain electrode both disposed on the first semiconductor member. Each of the first source electrode, the first drain electrode, and the second gate electrode may directly contact the first insulator.

The display device may include the following elements: a first insulating layer disposed on the substrate; a second insulating layer disposed on the first insulating layer; and a third insulating layer disposed on the second insulating layer. The third semiconductor member may be disposed between the substrate and the first insulating layer. The third gate electrode may be disposed between the first insulating layer and the second insulating layer. The first semiconductor member and the second semiconductor member may be disposed directly on the third insulating layer.

The first source electrode, the first drain electrode, and the second gate electrode may be disposed between the third insulating layer and the first insulator.

The display device may include the following elements: a connecting member connected to the first drain electrode through a contact hole formed in the first insulator; and a second insulator disposed on the connecting member. An electrode of the light-emitting diode element may be connected to the connecting member through a contact hole formed in the second insulator.

The display device may include the following elements: a data line configured to transmit a data signal; and a driving voltage line configured to transmit a driving voltage. The second transistor may be electrically connected to the data line. At least one of the first transistor and the third transistor may be electrically connected to the driving voltage line.

The pixel may include a storage capacitor electrically connected between the first gate electrode and the light-emitting diode element.

The pixel further may include a fourth transistor electrically connected to the first transistor. The fourth transistor may be a top gate type transistor and may include an oxide semiconductor member.

According to embodiments, in a pixel of a display device, a switching transistor may have a small leakage current and a high on/off ratio, a driving transistor may have small hysteresis and a wide driving range, and an emission control transistor may have high charge mobility and high reliability. In embodiments, the quantity of required masks may be minimized in forming the heterogeneous transistors.

DETAILED DESCRIPTION OF EMBODIMENTS

Figure 1:
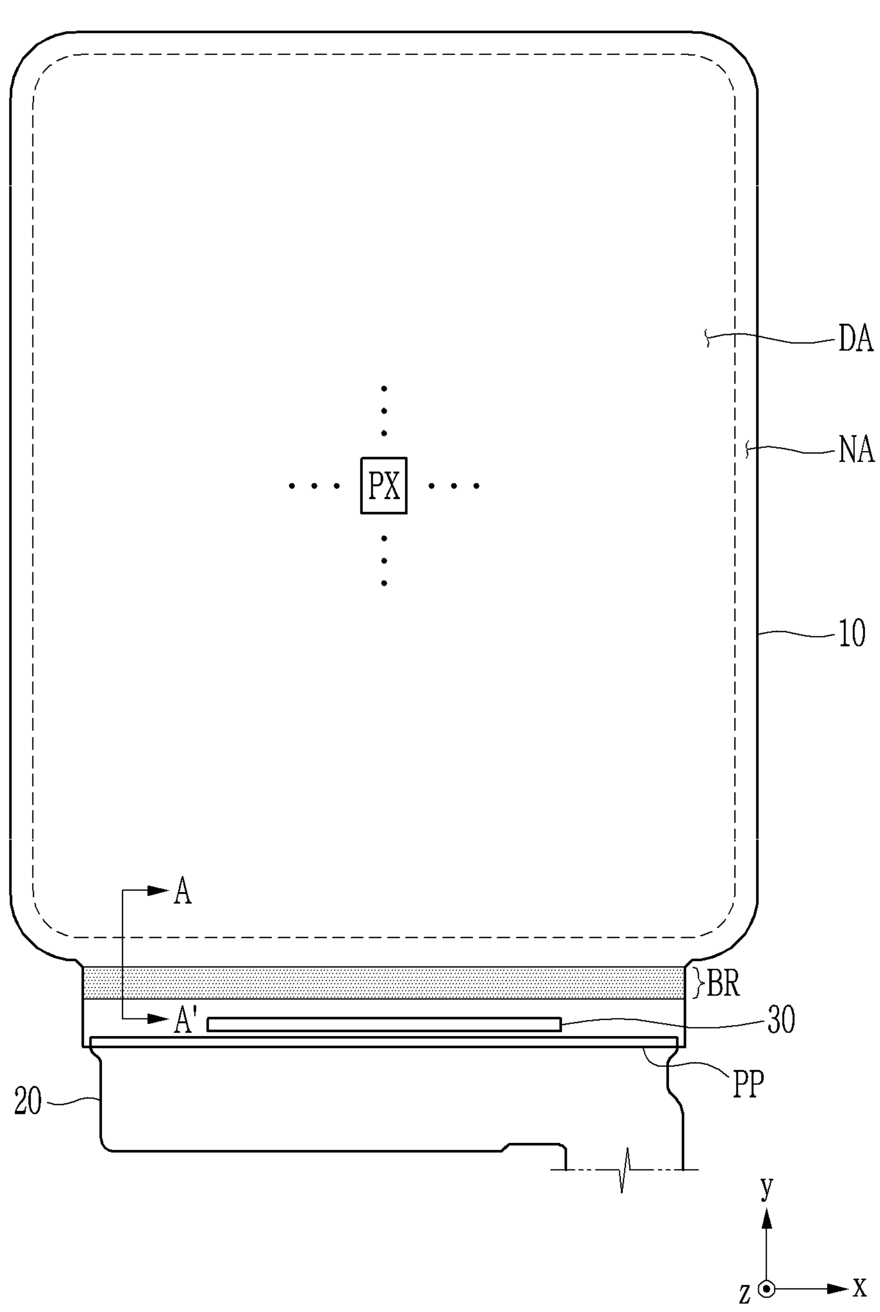
FIG. 1 is a top plan view schematically showing a display device according to an embodiment.

Example embodiments are described with reference to the accompanying drawings. As those skilled in the art would realize, the described embodiments may be modified in various ways.

Like reference numerals may designate like elements in the specification. In the drawings, thicknesses or sizes of layers and areas may be enlarged or reduced to clearly illustrate arrangements and relative positions.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and second element.

Unless explicitly described to the contrary, the word "comprise" and variations such as "comprises" or "comprising" may imply the inclusion of stated elements but not the exclusion of any other elements.

In the drawings, a reference character x is used to indicate a first direction, a reference character y is used to indicate a second direction perpendicular to the first direction, and a reference character z is used to indicate a third direction perpendicular to the first direction and the second direction.

The term "connect" may mean "electrically connect"; the term "insulate" may mean "electrically insulate"; the term "gray" may mean "grayscale."

FIG. 1 is a top plan view schematically showing a display device according to an embodiment.

Referring to FIG. 1, the display device includes a display panel 10, a flexible printed circuit film 20 connected to the display panel 10, a driving unit including an integrated circuit chip 30, and the like.

The display panel 10 includes a display area DA corresponding to a screen in which an image is displayed. The display panel 10 further includes a non-display area NA in which circuits for generating signals and/or signal lines for transmitting signals to the display area DA are disposed. The non-display area may abut and/or surround the display area DA.

Pixels PX are disposed in the display area DA of the display panel 10. Signal lines such as scan lines (i.e., gate lines), emission control lines, data lines, driving voltage lines, and the like are also disposed in the display area DA. Each pixel PX is connected to a scan line, an emission control line, a data line, and a driving voltage line, thereby receiving a scan signal (i.e., a gate signal), an emission control signal, a data signal, and a driving voltage from these signal lines.

The display area DA may include a touch sensor layer for sensing a contact or non-contact touch of a user. The display area DA may have a quadrangle shape with rounded corners, as shown in FIG. 1, but may have one or more of other shapes, such as polygonal, circular, and elliptical shapes.

A pad portion PP (formed with pads for receiving signals from the outside of the display panel 10) is disposed in the non-display area NA of the display panel 10. The pad portion PP may extend in a first direction x along one edge of the display panel 10. The flexible printed circuit film 20 is bonded to the pad portion PP, and pads of the flexible printed circuit film 20 may be electrically connected to pads of the pad portion PP.

The driving unit for generating and/or processing the various signals to drive the display panel 10 is disposed in the non-display area NA of the display panel 10. The driving unit may include the following elements: a data driver applying data signals to the data lines; a scan driver applying scan signals to the scan lines; an emission driver applying emission control signals to the emission control lines; and a signal controller controlling the data driver, the scan driver, and the emission driver. The scan driver and the emission driver may be integrated on the display panel 10, and may be disposed on opposite sides or one side of the display area DA. The data driver and the signal controller may be provided in an integrated circuit chip (referred to as to a driving IC chip) 30, and the integrated circuit chip 30 may be mounted to the non-display area NA of the display panel 10. The integrated circuit chip 30 may be mounted on a flexible printed circuit film connected to the display panel 10 so as to be electrically connected to the display panel 10.

The display panel 10 may include a bending region (BR). The bending region BR may be disposed in the non-display area NA between the display area DA and the pad portion PP. The bending region BR may cross the display panel 10 in the first direction x. The display panel 10 may be bent with a predetermined curvature radius based on a bending axis corresponding to the bending region BR. When the display panel 10 is a top emission type, the display panel 10 may be bent for the pad portion PP and the flexible printed circuit film 20 to be positioned behind the display panel 10. The bending region BR may be bent based on one bending axis, or a plurality of bending axes. In embodiments, the bending region BR may span the display area DA and the non-display area NA or may be disposed in the display area DA.

Figure 2:
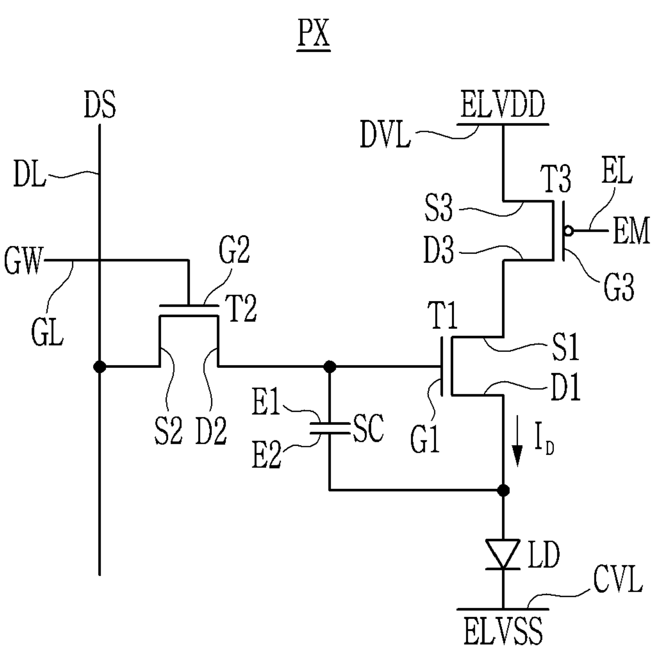
FIG. 2 is an equivalent circuit diagram of one pixel in the display device shown in FIG. 1 according to an embodiment.

FIG. 2 is an equivalent circuit diagram of one pixel in the display device shown in FIG. 1 according to an embodiment.

Referring to FIG. 2, the pixel PX includes a plurality of transistors (T1, T2, and T3), a storage capacitor SC, and a light-emitting diode element LD. Signal lines DL, GL, EL, DVL, and CVL are connected to the pixel PX.

The signal lines DL, GL, EL, and DVL may include a data line DL, a scan line GL, an emission control line EL, and a driving voltage line DVL. The scan line GL may transmit a scan signal GW to the second transistor T2. The emission control line EL may transmit an emission control signal EM to the third transistor T3. The data line DL may transmit a data signal DS. The driving voltage line DVL may transmit a driving voltage ELVDD.

The transistors T1, T2, and T3 include a first transistor T1 (a driving transistor), a second transistor T2 (a switching transistor), and a third transistor T3 (an emission control transistor). The transistors T1, T2, and T3 respectively include gate electrodes G1, G2, and G3, respectively include source electrodes S1, S2, and S3, and respectively include drain electrodes D1, D2, and D3.

The gate electrode G1 of the first transistor T1 is connected to the first electrode E1 of the storage capacitor SC and the drain electrode D2 of the second transistor T2, the source electrode S1 of the first transistor T1 is connected to the drain electrode D3 of the third transistor T3, and the drain electrode D1 of the first transistor T1 is connected to the anode of the light-emitting diode element LD. The first transistor T1 may supply a driving current $I_D$ (depending on a magnitude/value of the data signal DS transmitted through the second transistor T2) to the light-emitting diode element LD, and the light-emitting diode element LD may emit with a luminance depending on the magnitude/value of the driving current $I_D$. Accordingly, the pixel PX may display the luminance according a grayscale specified by the data signal DS. The driving current $I_D$ may be relative to the gate-source voltage $V_{GS}$, which is the voltage between the gate electrode G1 and the source electrode S1. As the voltage $V_{GS}$ of the first transistor T1 increases, the driving current $I_D$ may increase.

The gate electrode G2 of the second transistor T2 is connected to the scan line GL, the source electrode S2 of the second transistor T2 is connected to the data line DL, and the drain electrode D2 of the second transistor T2 is connected to the gate electrode G1 of the first transistor T1 and the first electrode E1 of the storage capacitor SC. The second transistor T2 is turned on depending on the scan signal GW transmitted through the scan line GL, thereby performing a switching operation in which the data signal DS transmitted through the data line DL is transmitted to the gate electrode G1 of the first transistor T1 and the first electrode E1 of the storage capacitor SC.

The gate electrode G3 of the third transistor T3 is connected to the emission control line EL, the source electrode S3 of the third transistor T3 is connected to the driving voltage line DVL, and the drain electrode D3 of the third transistor T3 is connected to the source electrode S1 of the first transistor T1. The third transistor T3 is turned on depending on the emission control signal EM transmitted through the emission control line EL, thereby controlling the current to flow through the first transistor T1. If the third transistor T3 is turned on, the driving current $I_D$ is generated depending on the magnitude of the data signal DS, and the driving current $I_D$ is supplied to the light-emitting diode element LD, thereby the light-emitting diode element LD emits light.

The first electrode E1 of the storage capacitor SC is connected to the gate electrode G1 of the first transistor T1 and the drain electrode D2 of the second transistor T2, and the second electrode E2 of the storage capacitor SC is connected to the drain electrode D1 of the first transistor T1 and the anode of the light-emitting diode element LD. The storage capacitor SC may continuously apply the data signal DS to the first transistor T1 to continuously activate the light-emitting diode element LD during the emission period. The cathode of the light-emitting diode element LD may be connected to the common voltage line CVL for receiving the common voltage ELVSS.

The first transistor T1 and the second transistor T2 are NMOS (n-channel metal oxide semiconductor) transistors. The third transistor T3 is a PMOS (p-channel metal oxide semiconductor) transistor or an NMOS transistor. Each of the first transistor T1 and the second transistor T2 may include an oxide semiconductor member and may be referred to as an "oxide transistor." The oxide semiconductor may include one or more oxides of one or more metals. The one or more metals may include one or more of zinc (Zn), indium (In), gallium (Ga), tin (Sn), and titanium (Ti), and a combination. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). The first transistor T1 may be a bottom gate type oxide transistor, and the second transistor T2 may be a top gate type oxide transistor. The third transistor T3 may include a polysilicon semiconductor member and may be referred to as a "silicon transistor."

According to an embodiment, a bottom gate oxide transistor with small hysteresis and a wide driving range is used as the driving transistor. A top gate oxide transistor with low leakage current and high on/off ratio is used as the switching transistor. A silicon transistor with high charge mobility is used as the emission control transistor. Since the driving range is large, the gate voltage VG of the first transistor T1 may be desirably changed to minutely control the grayscale of the light emitted from the light-emitting diode element LD, thereby improving the display quality of the display device. Since the leakage current is small, the occurrence of flicker may be minimized even at low frequency driving, so that power consumption may be reduced. Since the driving transistor is a bottom gate type oxide transistor, the characteristic deterioration of the driving transistor (for example, shifting of the threshold voltage Vth of the driving transistor) may be minimized since the gate electrode can block the light incident on the oxide semiconductor. Since the emission control transistor must be turned on during a relatively long emission period to steadily transmit a current, the silicon transistor with high reliability is advantageous.

Figure 3:
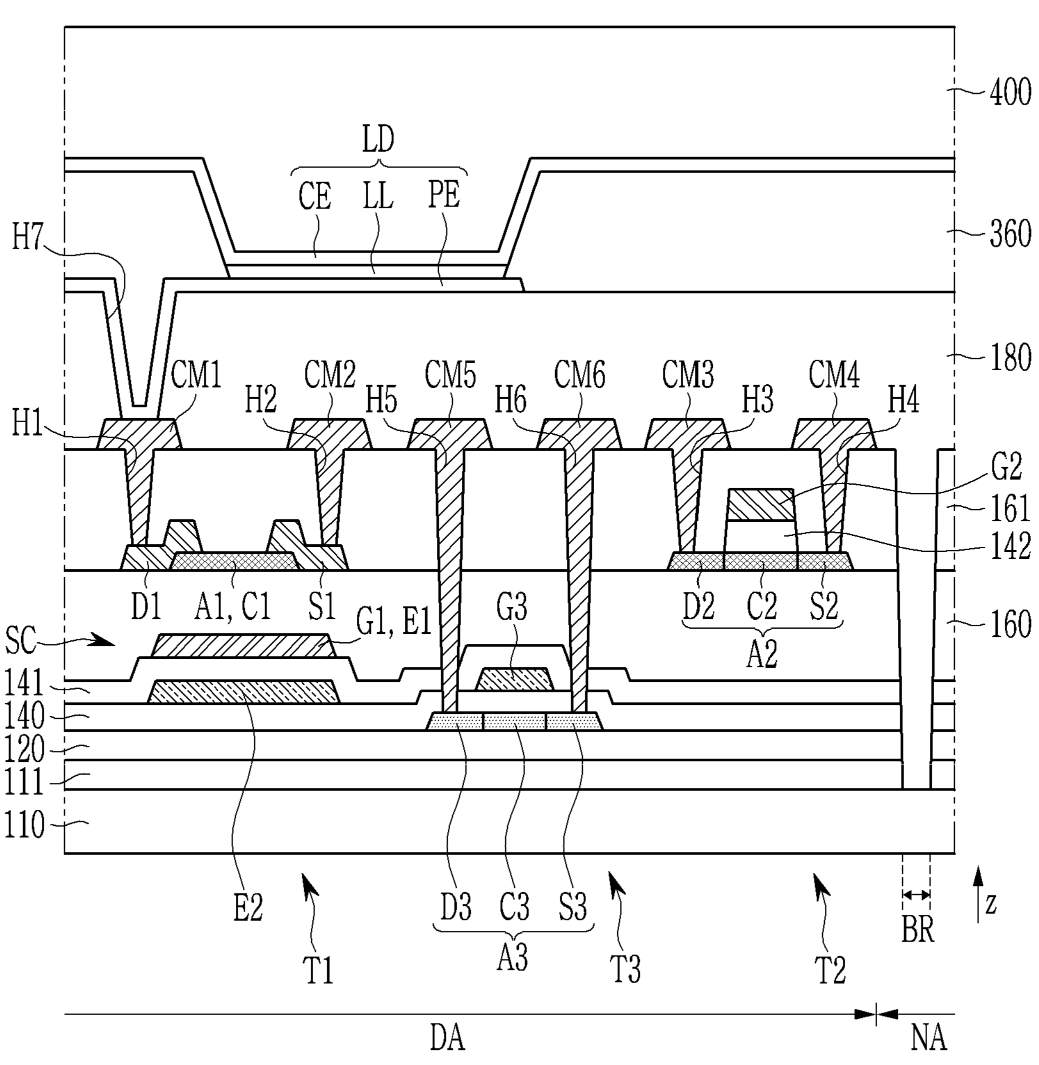
FIG. 3 is a schematic cross-sectional view taken along line A-A' in FIG. 1 according to an embodiment.

FIG. 3 is a schematic cross-sectional view taken along line A-A' in FIG. 1 according to an embodiment.

The display panel 10 includes a substrate 110 on which wiring and elements are formed. A very large number of pixels are arranged in the display area of the display panel 10. As an example, one pixel is illustrated and described with reference to FIG. 1, FIG. 2, and FIG. 3.

The substrate 110 may include a display area and a non-display area corresponding to the display area DA and the non-display area NA of the display panel 10 shown in FIG. 1. The substrate 110 may be a flexible substrate. The substrate 110 may be made of a polymer such as a polyimide, a polyamide, a polycarbonate, or polyethylene terephthalate. The substrate 110 may be made of glass, quartz, ceramic, or the like.

A barrier layer 111 for preventing moisture from penetrating from the outside is disposed on the substrate 110. The barrier layer 111 may include an inorganic insulating material such as a silicon oxide ($SiO_x$) or a silicon nitride ($SiN_x$).

A buffer layer 120 is disposed on the barrier layer 111. The buffer layer 120 may block an impurity that may diffuse from the substrate 110 during the crystallization process for forming the polysilicon and may reduce stress applied to the substrate 110. The buffer layer 120 may include an inorganic insulating material such as a silicon oxide and/or a silicon nitride.

A semiconductor member A3 of the third transistor T3, including the source electrode S3, the drain electrode D3, and the channel C3 of the third transistor T3, may be disposed on the buffer layer 120. The semiconductor member A3 includes a polysilicon.

A first insulating layer 140 including an inorganic insulating material such as a silicon oxide and/or a silicon nitride is disposed on the semiconductor member A3. The first insulating layer 140 may be referred to as a first gate insulating layer.

A gate conductor set including the gate electrode G3 of the third transistor T3 and the second electrode E2 of the storage capacitor SC is disposed on the first insulating layer 140. The gate conductor set may include a metal such as molybdenum (Mo), copper (Cu), aluminum (Al), silver (Ag), chromium (Cr), tantalum (Ta), and titanium (Ti), or a metal alloy. The emission control line EL may be disposed directly on the same insulating layer 140 as the gate electrode G3.

A second insulating layer 141 is disposed on the first insulating layer 140 and the gate conductor set. The second insulating layer 141 may include an inorganic insulating material such as a silicon oxide and/or a silicon nitride, and may be referred to as a second gate insulating layer.

The gate electrode G1 of the first transistor T1 is disposed on the second insulating layer 141. The gate electrode G1 may also be (and/or function as) the first electrode E1 of the storage capacitor SC. The gate electrode G1 may include a metal such as molybdenum (Mo), copper (Cu), aluminum (Al), silver (Ag), chromium (Cr), tantalum (Ta), and titanium (Ti), or the metal alloy.

A third insulating layer 160 is disposed on the second insulating layer 141 and the gate electrode G1. The third insulating layer 160 may include an inorganic insulating material such as a silicon oxide and/or a silicon nitride, and may be referred to as a first interlayer insulating layer.

The semiconductor member A1 of the first transistor T1 and the semiconductor member A2 of the second transistor T2 are disposed on the third insulating layer 160. In the semiconductor member A1, the portion that is not covered by either of the source electrode S1 and the drain electrode D1 may form the channel C1 of the first transistor T1. The semiconductor member A2 includes the source electrode S2, the drain electrode D2, and the channel C2 of the second transistor T2. The first semiconductor member A1 and the second semiconductor member A2 include the same oxide semiconductor material.

The source electrode S1 and the drain electrode D1 of the first transistor T1 are disposed (directly) on the semiconductor member A1. An insulator 142 and the gate electrode G2 of the second transistor T2 are sequentially disposed on the semiconductor member A2. The insulator 142 may include an inorganic insulating material such as a silicon oxide and/or a silicon nitride. Each of the source electrode S1 for the first transistor T1, the drain electrode D1 of the first transistor T1, and the gate electrode G2 of the second transistor T2 may include at least one of molybdenum (Mo), copper (Cu), aluminum (Al), silver (Ag), chromium (Cr), tantalum (Ta), titanium (Ti), and the like, and/or may have a multilayer structure such as a structure including titanium (Ti) and molybdenum (Mo). A titanium layer may prevent impurities (such as hydrogen) from penetrating into the semiconductor members A1 and A2 in the manufacturing process. The scan line GL transmitting the scan signal GW may be formed from the same material layer(s) as the gate electrode G2.

The semiconductor member A1 (including the channel C1), the source electrode S1, the drain electrode D1, and the gate electrode G1 form the first transistor T1. The semiconductor member A2 including the channel C2, the source electrode S2, the drain electrode D2, and the gate electrode G2 form the second transistor T2. The semiconductor member A3 (including the channel C3), the source electrode S3, the drain electrode D3, and the gate electrode G3 form the third transistor T3. The first transistor T1 is a bottom gate type oxide transistor, the second transistor T2 is a top gate type oxide transistor, and the third transistor T3 is a top gate type silicon transistor.

If a top gate type oxide transistor is used as the driving transistor, since the driving range is narrow, an undesirable smear due to luminance non-uniformity may be generated. If a bottom gate type oxide transistor is used as the switching transistor, the on-current may be undesirably low due to the third insulating layer 160, which may be thicker than the insulator 142; if the width of the transistor is increased in order to improve the on-current, the transistor configuration may not be suitable for a high resolution display device. For example, the thickness of the insulator 142 may be in a range of about 1000 angstroms to about 2000 angstroms, and the thickness of the third insulating layer 160 may be about 3000 angstroms or more. According to an embodiment, a bottom gate type oxide transistor (the first transistor T1) may be used as the driving transistor to widen the driving range of the driving transistor, and a top gate type oxide transistor (the second transistor T2) may be used as the switching transistor to increase the on/off ratio of the switching transistor. In an embodiment, the third transistor T3, which has high charge mobility and is stable, is used as the emission control transistor, thereby reliably transmitting the current and/or voltage from the driving voltage line DVL to the first transistor T1. A total number of masks and process steps may be reduced by forming the source electrode S1 of the first transistor T1, the drain electrode D1 of the first transistor T1, and the gate electrode G2 of the second transistor T2 using the same material layer.

A fourth insulating layer 161 is disposed on the source electrode S1, the drain electrode D1, and the gate electrode G2. The fourth insulating layer 161 may include an inorganic insulating material such as a silicon oxide and/or a silicon nitride, and may be referred to as a second interlayer insulating layer. The fourth insulating layer 161 may cover lateral sides of the insulator 142 as well as sides of the gate electrode G2.

Connecting members CM1 to CM6 are disposed on and through the fourth insulating layer 161. The connecting members CM1 to CM6 may include a connecting member CM1 and a connecting member CM2 respectively connected to the drain electrode D1 and the source electrode S1 through contact holes H1 and H2 formed in the fourth insulating layer 161, may include a connecting member CM3 and a connecting member CM4 respectively connected to the drain electrode D2 and the source electrode S2 through contact holes H3 and H4 formed in the fourth insulating layer 161, and may include a connecting member CM5 and a connecting member CM6 respectively connected to the drain electrode D3 and the source electrode S3 through contact holes H5 and H6 formed in the fourth insulating layer 161, the third insulating layer 160, the second insulating layer 141, and the first insulating layer 140.

The connecting member CM1 may be electrically connected to the second electrode E2 of the storage capacitor SC, and the connecting member CM2 may be electrically connected to the connecting member CM5. The connecting member CM3 may be electrically connected to the gate electrode G1 of the first transistor T1, and the connecting member CM4 may be electrically connected to the data line DL. The connecting member CM6 may be electrically connected to the driving voltage line DVL. The data line DL and/or the driving voltage line DVL may be formed from the same material layer(s) as the connecting members CM1 to CM6.

The connecting members CM1 to CM6 may include a metal or a metal alloy of at least one of aluminum (Al), copper (Cu), silver (Ag), gold (Au), platinum (Pt), palladium (Pd), nickel (Ni), molybdenum (Mo), titanium (Ti), chromium (Cr), tantalum (Ta), and the like. The connecting members CM1 to CM6 may have a multilayer structure such as a titanium-aluminum-titanium, titanium-copper-titanium, or molybdenum-aluminum-titanium structure.

A fifth insulating layer 180 is disposed on the fourth insulating layer 161 and the connecting members CM1 to CM6. The fifth insulating layer 180 may include an organic insulating material such as a polyimide, an acryl-based polymer, or a siloxane-based polymer. The fifth insulating layer 180 may be referred to as a passivation layer or a planarization layer.

A pixel electrode PE of the light-emitting diode element LD is disposed on the fifth insulating layer 180. The pixel electrode PE is connected to the first connecting member CM1 through the contact hole H7 formed in the fifth insulating layer 180. Since the first connecting member CM1 is connected to the drain electrode D1 of the first transistor T1, the pixel electrode PE may be electrically connected to the drain electrode D1. The pixel electrode PE may include a metal or a metal alloy of at least one of silver (Ag), nickel (Ni), gold (Au), platinum (Pt), aluminum (Al), copper (Cu), aluminum neodymium (AlNd), aluminum nickel lanthanum (AlNiLa), and the like. The pixel electrode PE may include a transparent conductive material such as at least one of indium tin oxide (ITO), indium zinc oxide (IZO), and the like. The pixel electrode PE may have a multilayer structure such as an ITO-silver (Ag)-ITO or ITO-aluminum (Al) structure.

An insulating layer 360 having an opening exposing the pixel electrode PE is disposed on the fifth insulating layer 180. The insulating layer 360 may be referred to as a pixel definition layer, and the opening may define a pixel area. The insulating layer 360 may include an organic insulating material.

An emission layer LL is disposed on the pixel electrode PE, and a common electrode CE is disposed on the emission layer LL. The emission layer LL may be an organic emission layer including a low molecular organic material or a polymer organic material. The common electrode CE is formed by thinly one or more laminating metals having low work functions such as one or more of calcium (Ca), barium (Ba), magnesium (Mg), aluminum (Al), silver (Ag), and the like to have a light transmitting property. The common electrode CE may be formed of a transparent conductive material such as ITO and/or IZO.

The pixel electrode PE, the emission layer LL, and the common electrode CE of each pixel PX form the light-emitting diode element LD, such as an organic light emitting diode. The pixel electrode PE may be an anode (which is a hole injection electrode), and the common electrode CE may be a cathode (which is an electron injection electrode). Depending on the driving method of the display device, the pixel electrode PE may be the cathode and the common electrode CE may be the anode.

An encapsulation layer 400 is disposed on the second electrode E2. The encapsulation layer 400 seals the light-emitting diode element LD to prevent moisture or oxygen from penetrating from the outside. The encapsulation layer 400 may include at least one inorganic layer and at least one organic layer.

A polarization layer may be disposed on the encapsulation layer 400 to reduce external reflection, and a touch sensor layer including touch electrodes for sensing a touch may be disposed between the encapsulation layer 400 and the polarization layer.

Portions of the barrier layer 111, the buffer layer 120, the first insulating layer 140, the second insulating layer 141, the third insulating layer 160, and the fourth insulating layer 161 (which may include one or more inorganic insulating materials) may be removed in the bending region BR. An inorganic insulating layer may be vulnerable to cracking during bending.

FIG. 4, FIG. 5, FIG. 6, FIG. 7, FIG. 8, FIG. 9, FIG. 10, FIG. 11, FIG. 12, FIG. 13, and FIG. 14 are cross-sectional views schematically showing structures formed in a manufacturing process of the display device shown in FIG. 3 according to an embodiment.

Figure 4:
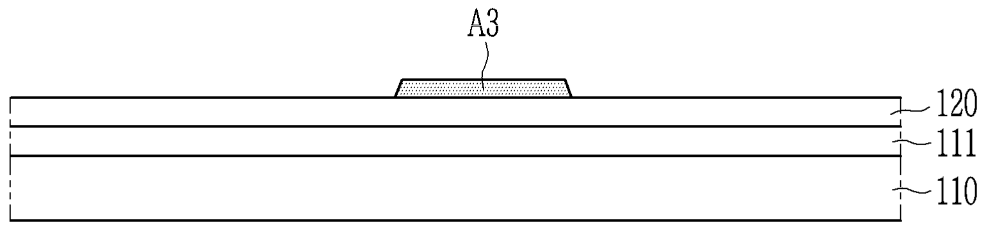
FIG. 4, FIG. 5, FIG. 6, FIG. 7, FIG. 8, FIG. 9, FIG. 10, FIG. 11, FIG. 12, FIG. 13, and FIG. 14 are cross-sectional views schematically showing structures formed in a manufacturing process of the display device shown in FIG. 3 according to an embodiment.

Referring to FIG. 4, one or more inorganic insulating materials are deposited on a substrate 110 by one or more chemical vapor deposition (CVD) processes to form a barrier layer 111 and a buffer layer 120. Next, amorphous silicon is deposited on the buffer layer 120 by a CVD process to form an amorphous silicon layer, the amorphous silicon layer is crystallized to form a polysilicon layer, and the polysilicon layer is patterned by a photolithography process using a first mask to form a semiconductor member A3.

Figure 5:
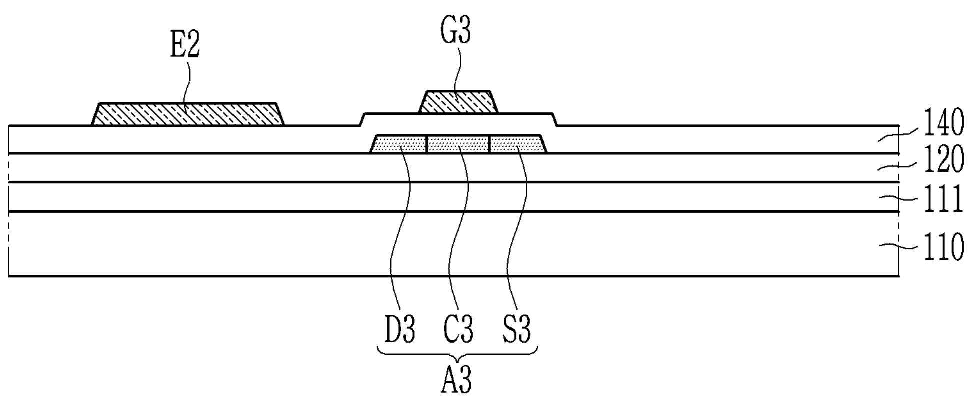

Referring to FIG. 5, an inorganic insulating material is deposited to form a first insulating layer 140. Next, a conductive material such as a metal is deposited on the first insulating layer 140 by a sputtering method to form a conductive layer, and the conductive layer is patterned by a photolithography process using a second mask to form a gate electrode G3 of a third transistor T3 and a second electrode E2 of a storage capacitor SC. The emission control line EL may be formed of the same material in the same process as the gate electrode G3. Then, the semiconductor member A3 is subjected to ion doping by using the gate electrode G3 as a mask, and activation processing to form a source electrode S3 and a drain electrode D3 with low resistance.

Figure 6:
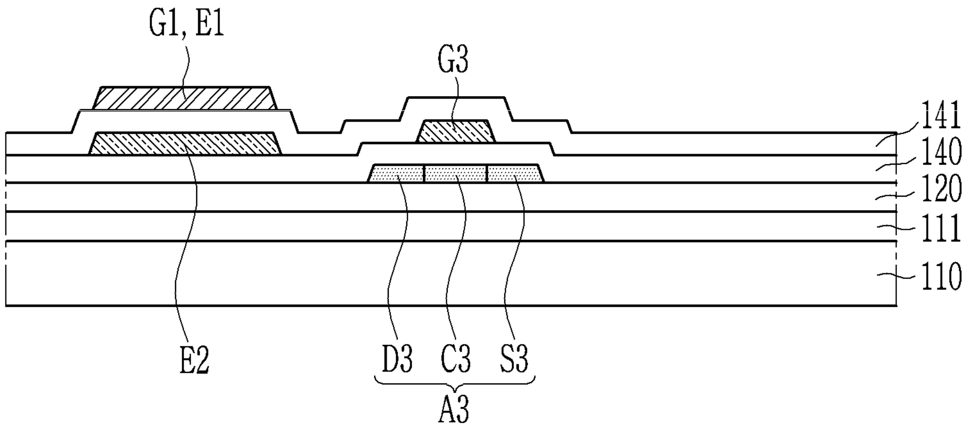

Referring to FIG. 6, a second insulating layer 141 is formed by depositing an inorganic insulating material. The conductive layer is formed on the second insulating layer 141 by a conductive material, and the conductive layer is patterned by a photolithography process using a third mask to form a gate electrode G1 of the first transistor T1. The gate electrode G1 may also be the first electrode E1 of the storage capacitor SC.

Figure 7:
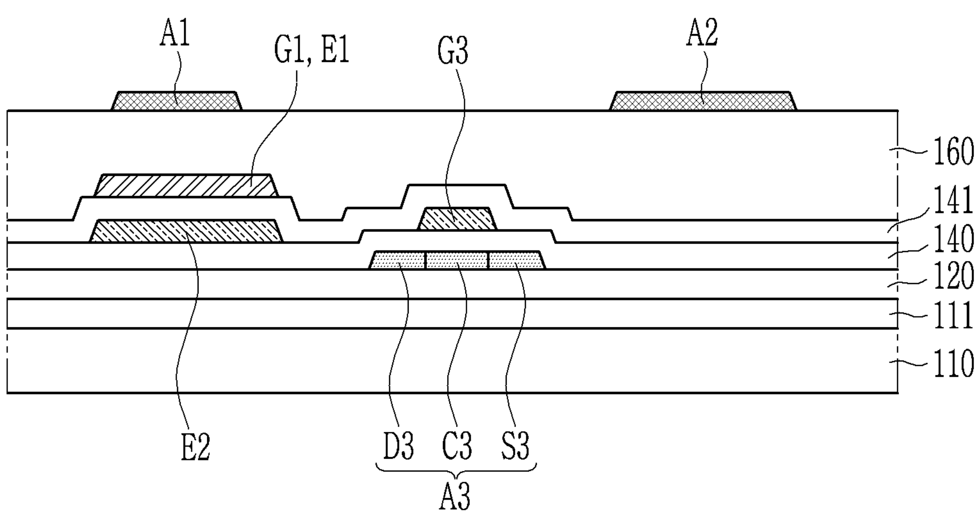

Referring to FIG. 7, the third insulating layer 160 is formed by depositing an inorganic insulating material. An oxide semiconductor material is deposited on the third insulating layer 160 by a CVD process to form an oxide semiconductor layer, and the oxide semiconductor layer is patterned by a photolithography process using a fourth mask to form a semiconductor member A1 and a semiconductor member A2.

Figure 8:
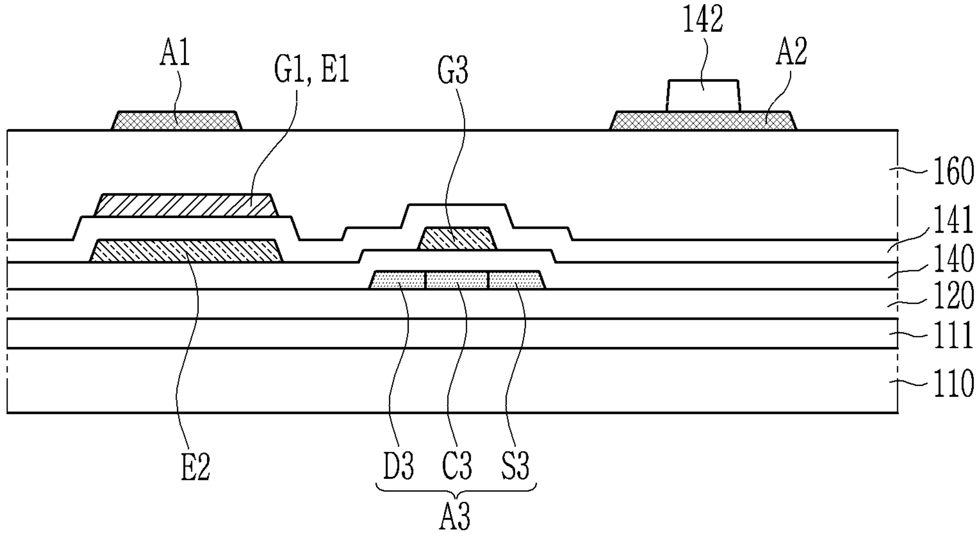

Referring to FIG. 8, an inorganic insulating material is deposited to form an insulating layer, and patterning is performed with a photolithography process using a fifth mask to form an insulator 142.

Figure 9:
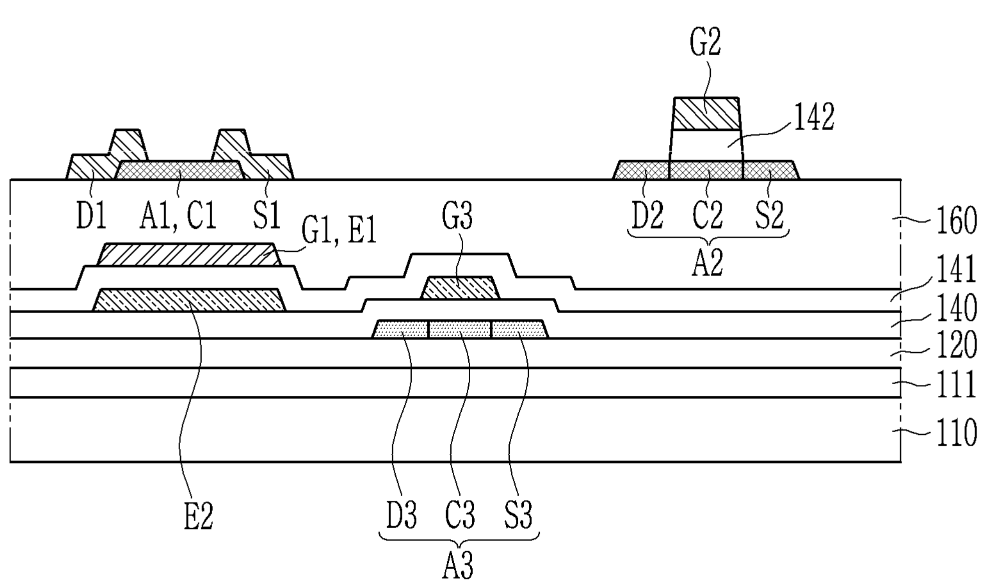

Referring to FIG. 9, conductive layer is formed by depositing a conductive material, and the conductive layer is patterned by a photolithography process using a sixth mask to form the source electrode S1 of the first transistor T1, the drain electrode D1 of the first transistor T1, and the gate electrode G2 of the second transistor T2. The scan line GL may be formed of the same material in the same process as the gate electrode G2. Subsequently, portions of the semiconductor member A2 that are exposed without being covered by the insulator 142 may be processed to form the source electrode S2 and the drain electrode D2. As the processing method, at least one of a plasma processing method, a heat processing method in a reducing atmosphere, and the like may be used. For example, the plasma process may be performed in a hydrogen gas or fluorine gas atmosphere. As a result, hydrogen or fluorine is diffused in the exposed portions of the semiconductor member A2 that are exposed without being covered by the insulator 142, such that the exposed portions become conductive. The portion of the semiconductor member A2 covered by the insulator 142 mostly retains the semiconductor nature to form a channel C2. The plasma processing may be performed using a mask (e.g., forming a photosensitive film pattern that exposes only the portions of the semiconductor member A2 designated for the source electrode S2 and the drain electrode D2) so that the semiconductor member A1 is not affected. Formation of the source electrode S2 and the drain electrode D2 by doping the semiconductor member A2 may be performed after formation of the insulator 142 in the step shown in FIG. 8.

Figure 10:
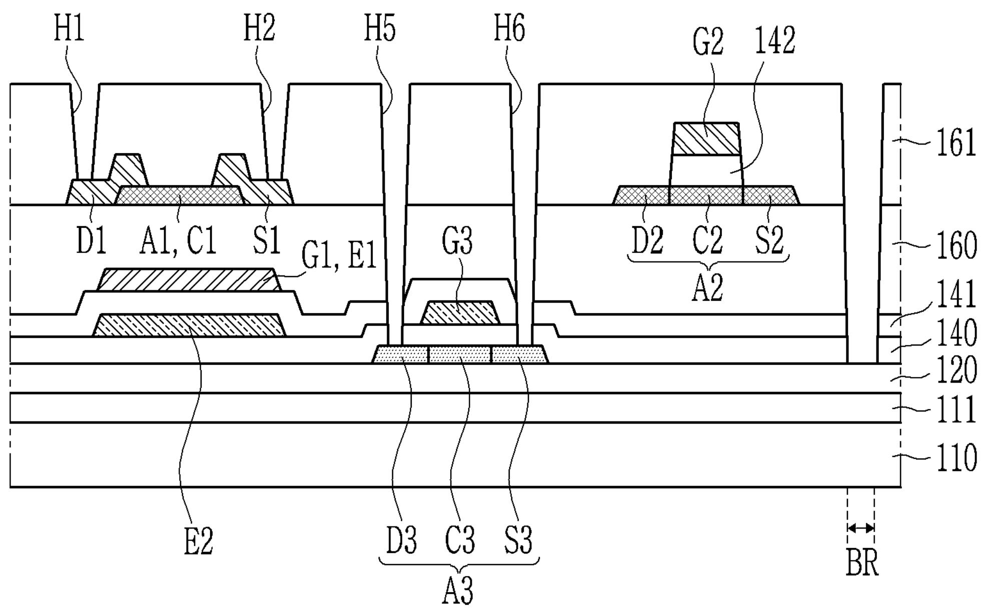

Referring to FIG. 10, an inorganic insulating material is deposited to form a fourth insulating layer 161. Next, a seventh mask is used to pattern the first to fourth insulating layers 140, 141, 160, and 161 to form contact holes H5 and H6 exposing the drain electrode D3 and the source electrode S3 of the third transistor T3. In the same process step, the fourth insulating layer 161 is patterned using the same seventh mask to form contact holes H1 and H2 exposing the drain electrode D1 and the source electrode S1 of the first transistor T1. In the same process steps, portions of the first to fourth insulating layers 140, 141, 160, and 161 may be removed in the bending region BR. After forming the contact holes H5 and H6, an oxide film formed on the surface of the semiconductor member A3 can be removed using an etchant.

Figure 11:
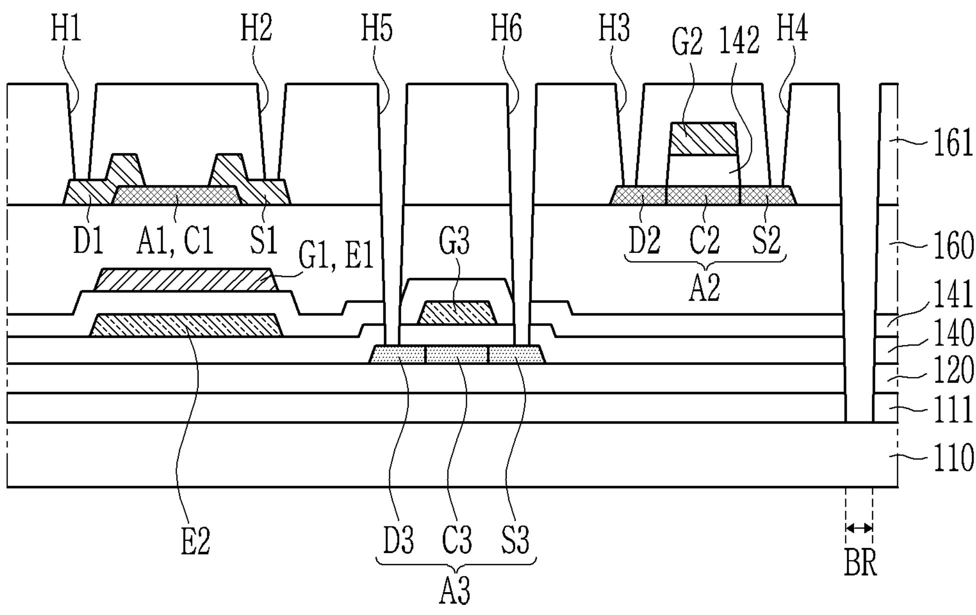

Referring to FIG. 11, the fourth insulating layer 161 is patterned by a photolithography process using an eighth mask to form contact holes H3 and H4 exposing the drain electrode D2 and the source electrode S2 of the second transistor T2. In the same process step, portions of the barrier layer 111 and the buffer layer 120 may be removed from the bending region BR. The reason why the contact holes H3 and H4 are formed using a separate eighth mask instead of the seventh mask (used for forming the contact holes H5 and H6) is that the etchant may etch or damage the semiconductor member A2 through the contact holes H3 and H4 when etching the oxide layer on the surface of the semiconductor member A3 through the contact holes H5 and H6 if the contact holes H3, H4, H5, and H6 are formed in the same process step. In an embodiment, contact holes H1 and H2 may not be formed in the same step as the contact holes H5 and H6, but may be formed in the same step as the contact holes H3 and H4.

Figure 12:
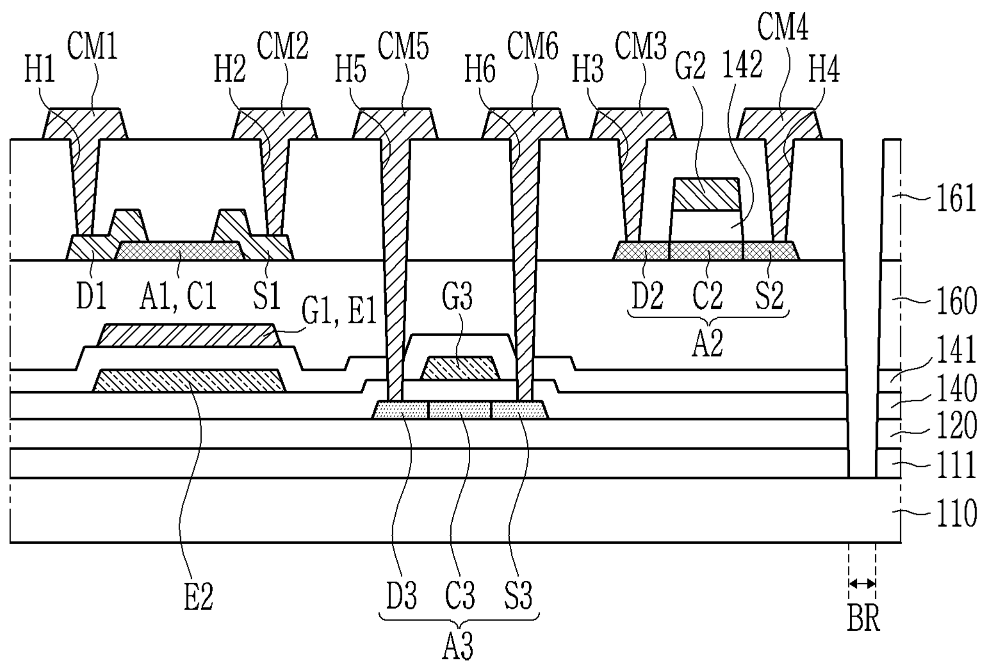

Referring to FIG. 12, a conductive layer is formed by depositing a conductive material on the fourth insulating layer 161, and the conductive layer is patterned by a photolithography process using a ninth mask to form connecting members CM1 to CM6 that are connected to the source electrodes S1, S2, and S3 and the drain electrodes D1, D2, and D3 of the first to third transistors T1, T2, and T3. In the process step, the connecting member CM2 and the connecting member CM5 may be formed to be connected to each other. The data line DL and the driving voltage line DVL may be formed of the same material in the same process as the connecting members CM1 to CM6. The connecting member CM4 may be part of the data line DL and the connecting member CM6 may be part of the driving voltage line DVL.

Figure 13:
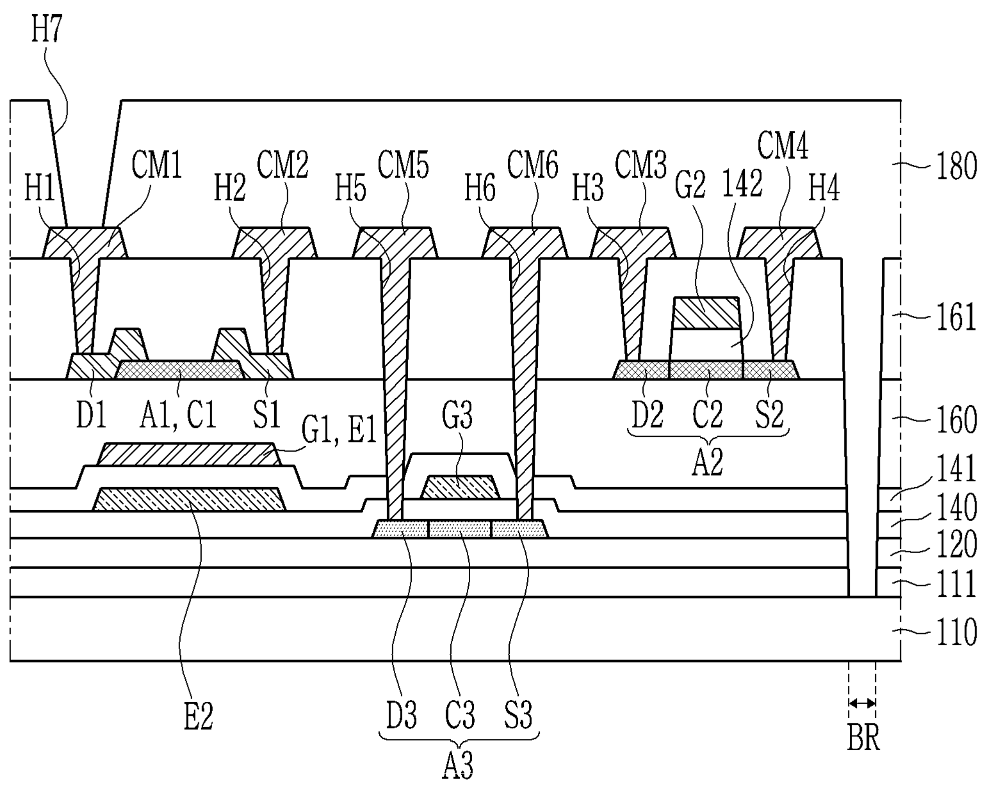

Referring to FIG. 13, an organic insulating material is deposited to form a fifth insulating layer 180, and the fifth insulating layer 180 is patterned using a tenth mask to form a contact hole H7 exposing the connecting member CM1.

Figure 14:
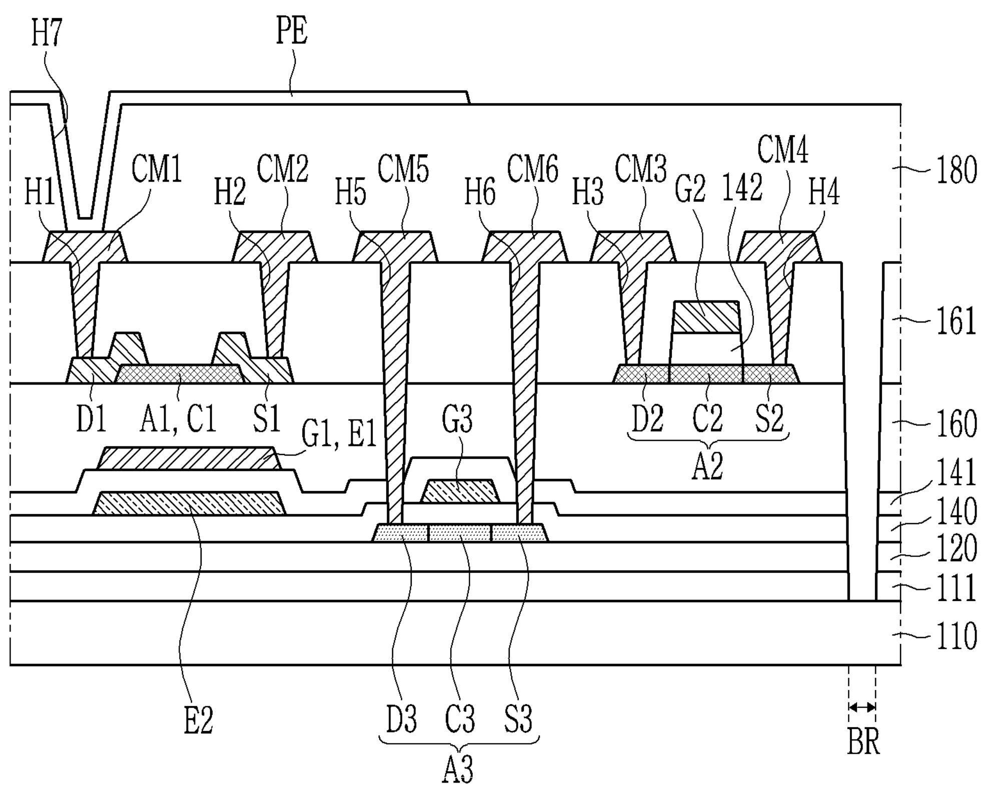

Referring to FIG. 14, a conductive layer is formed by depositing the conductive material on the fifth insulating layer 180, and the conductive layer is patterned by a photolithography process using an eleventh mask to form a pixel electrode PE. The pixel electrode PE is connected to the connecting member CM1 through the contact hole H7.

Figure 15:
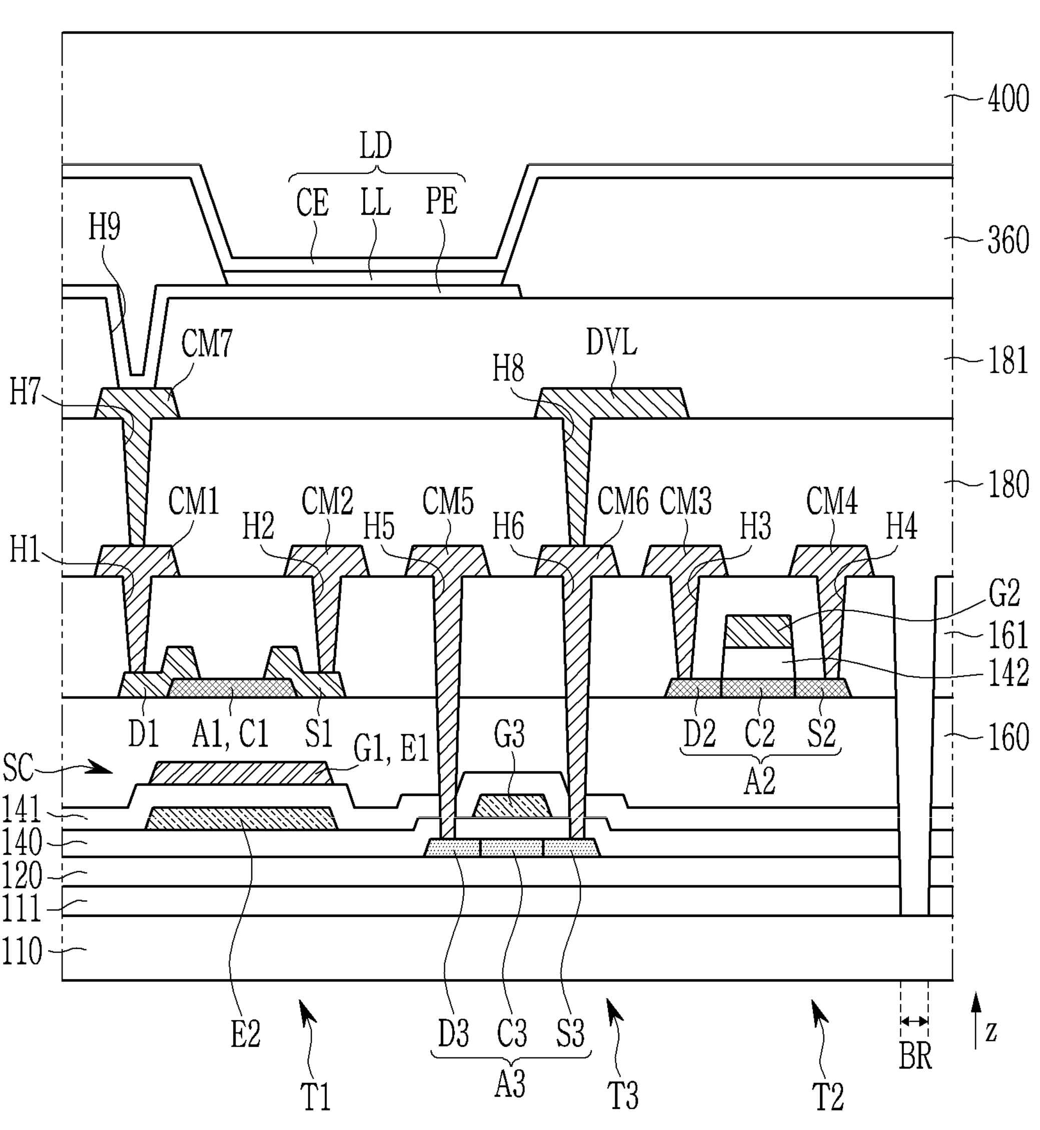
FIG. 15 is a schematic cross-sectional view of a display device according to an embodiment.
Figure 16:
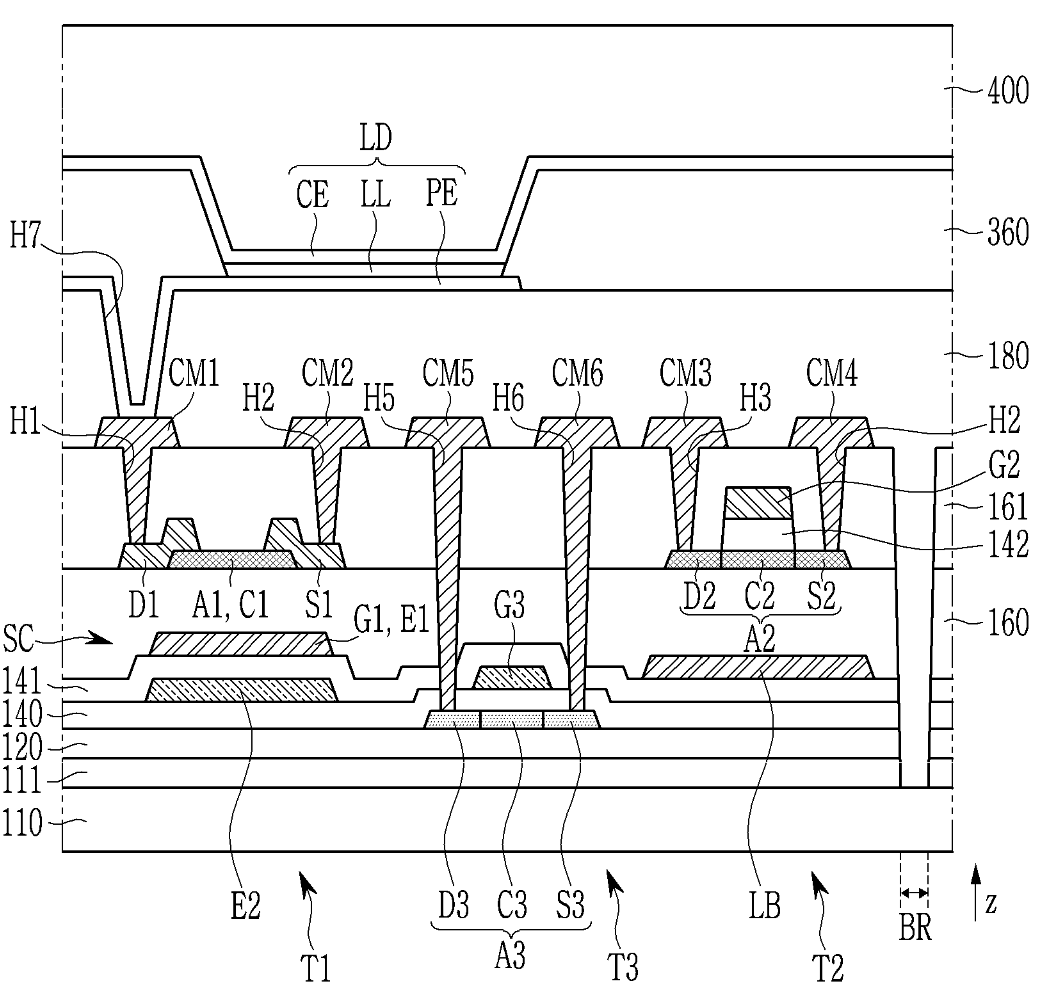
FIG. 16 is a schematic cross-sectional view of a display device according to an embodiment.

As a following process, referring to FIG. 3, an organic insulating material is deposited on the pixel electrode PE to form an insulating layer 360, and the insulating layer 360 is patterned using a twelfth mask to form an opening exposing the pixel electrode PE. Next, an emission layer LL and a common electrode CE are formed, and then an encapsulation layer 400 is formed to manufacture the display device shown in FIG. 3. FIG. 15 is a schematic cross-sectional view of a display device according to an embodiment. FIG. 16 is a schematic cross-sectional view of a display device according to an embodiment. For the embodiments illustrated in FIG. 15 and FIG. 16, differences from the embodiment of FIG. 3 are mainly described, and description of the same configurations may not be repeated.

Referring to FIG. 15, the driving voltage line DVL is disposed on the fifth insulating layer 180, and a sixth insulating layer 181 is disposed on the driving voltage line DVL. The driving voltage line DVL may be connected to the source electrode S3 of the third transistor T3 through a contact hole H8 formed in the fifth insulating layer 180. To electrically connect the pixel electrode PE and the connecting member CM1, a connecting member CM7 is connected to the connecting member CM1 through a contact hole H7 formed in the fifth insulating layer 180, and the pixel electrode PE is connected to the connecting member CM7 through the contact hole H9 formed in the sixth insulating layer 181.

The driving voltage line DVL may overlap the data line DL disposed on the same layer as the connecting members CM1 to CM6, so that the region/area occupied by the wiring in the display device may be reduced, for increasing the resolution of the display device. If the driving voltage line DVL is formed on the same layer as the connecting members CM1 to CM6, the driving voltage line DVL may include at least two wires in at least two different material layers, the resistance of the driving voltage line DVL may be reduced. The driving voltage line DVL and the connecting member CM7 may include a metal or a metal alloy of at least one of aluminum (Al), copper (Cu), silver (Ag), gold (Au), platinum (Pt), palladium (Pd), nickel (Ni), and molybdenum, may include a metal or a metal alloy of at least one of tungsten (W), titanium (Ti), chromium (Cr), and tantalum (Ta), and may have a multi-layer structure. The sixth insulating layer 181 may include an organic insulating material.

Referring to FIG. 16, a light blocking layer LB overlapping the semiconductor member A2 of the second transistor T2 is disposed between the semiconductor member A2 and the substrate 110. Since the second transistor T2 is a top gate type transistor, light incident from the bottom of the display panel 10 may not be blocked by the gate electrode G2. By forming the light blocking layer LB, it is possible to prevent external light from reaching the semiconductor member A2, especially the channel C2, thereby preventing characteristic deterioration of the semiconductor member A2 and controlling the leakage current of the second transistor T2.

The light blocking layer LB may be disposed between the second insulating layer 141 and the third insulating layer 160 as shown. In an embodiment, the light blocking layer LB may be formed of the same material in the same process as the gate electrode G1 of the first transistor T1. Alternatively or additionally, the light blocking layer LB may be disposed between the first insulating layer 140 and the second insulating layer 141; in an embodiment, the light blocking layer LB may be formed of the same material in the same process as the gate electrode G3 of the third transistor T3. In either case, it does not require any additional mask to form a light blocking layer LB.

Figure 17:
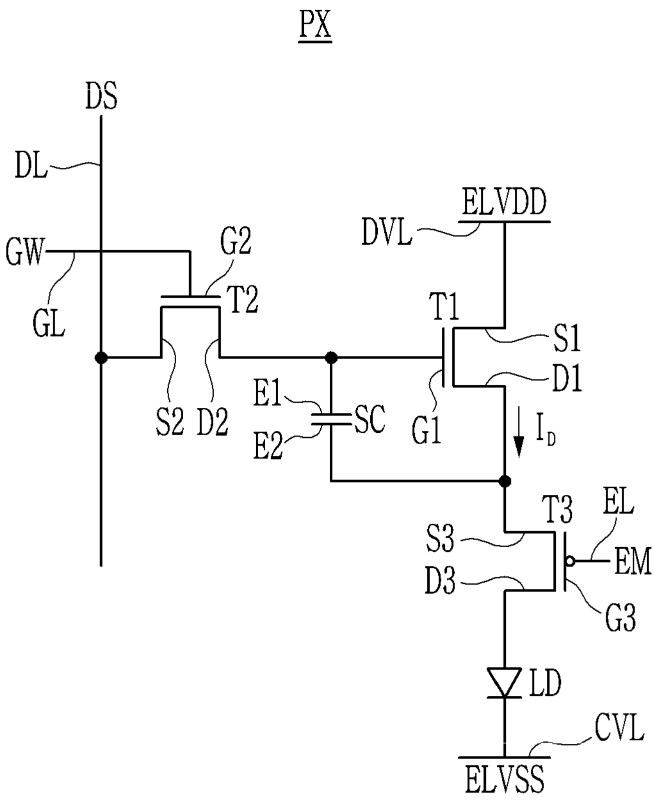
FIG. 17 is an equivalent circuit diagram of one pixel in a display device according to an embodiment.
Figure 18:
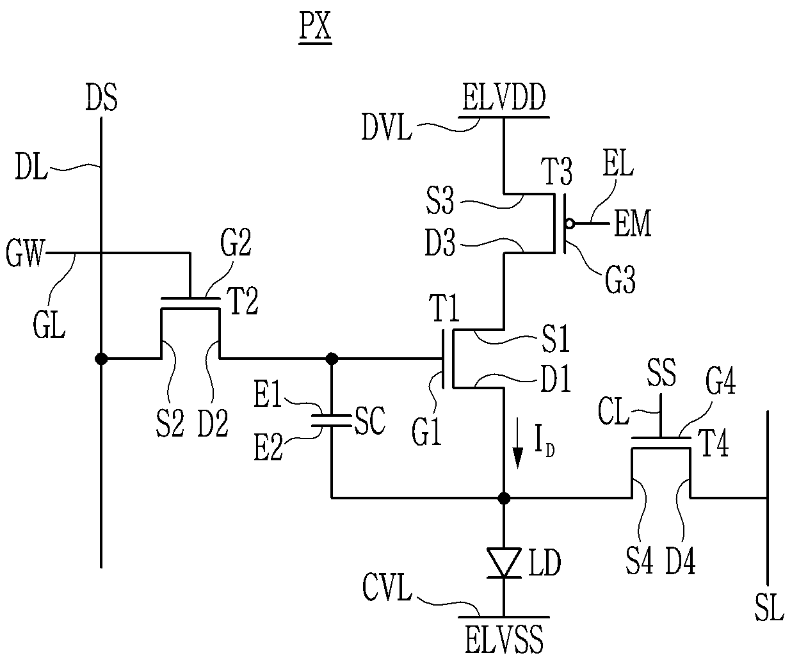
FIG. 18 is an equivalent circuit diagram of one pixel in a display device according to an embodiment.
Figure 19:
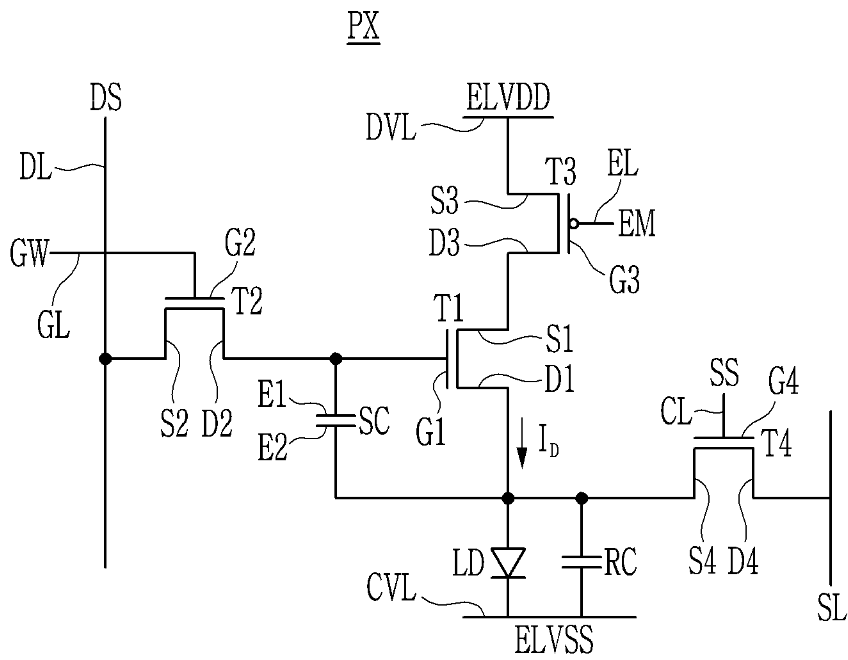
FIG. 19 is an equivalent circuit diagram of one pixel in a display device according to an embodiment.

Each of FIG. 17, FIG. 18, and FIG. 19 shows an equivalent circuit diagram of one pixel in a display device according to an embodiment. For the embodiments of FIG. 17, FIG. 18, and FIG. 19, differences from the embodiment of FIG. 2 are mainly described, and description of the same configurations may not be repeated.

Referring to FIG. 17, a structure in the connection of the third transistor T3, which is the emission control transistor, is different from the embodiment of FIG. 2. Specifically, the third transistor T3 is connected between the first transistor T1 and the light-emitting diode element LD. Thus, the first transistor T1, which is the driving transistor, is connected to the driving voltage line DVL. The driving current $I_D$ from the first transistor T1 (which depends on the data signal DS) is supplied to the light-emitting diode element LD if the third transistor T3 is turned on during the emission period depending on the emission control signal EM, and accordingly the light-emitting diode element LD may emit light during the emission period to display a predetermined grayscale. The types and stacking structures of the first to third transistors T1, T2, and T3 may be the same as or similar to those shown in FIG. 2 and FIG. 3.

Referring to FIG. 18, the pixel PX is different from the embodiment of FIG. 2 at least in further including a fourth transistor T4 connected to the drain electrode D1 of the first transistor T1. The gate electrode G4 of the fourth transistor T4 is connected to a sensing control line CL, the source electrode S4 of the fourth transistor T4 is connected to the drain electrode D1 of the first transistor T1 and the anode of the light-emitting diode element LD, and the drain electrode D4 of the fourth transistor T4 is connected to the sensing line SL. The fourth transistor T4 is a sensing transistor for sensing a characteristic such as a threshold voltage Vth of the first transistor T1, which may affect image quality. As the fourth transistor is turned on in response to the sensing signal SS transmitted through the sensing control line CL, the first transistor T1 and the sensing line SL are electrically connected, and a sensing unit connected to the sensing line SL may sense characteristic information of the first transistor T1 during a sensing period. As the characteristic information sensed through the fourth transistor T4 during the sensing period is reflected to generate the compensated data signal, the characteristic deviation of the first transistor T1, which may be different for each pixel PX, may be compensated externally.

The fourth transistor T4 may be an oxide transistor, and may have the same or similar stacking structures as the second transistor T2 shown in FIG. 3. The fourth transistor T4 may include a gate electrode disposed on a semiconductor member (which includes the oxide semiconductor material of the semiconductor member A2). The sensing accuracy may be maximized using the top gate type oxide transistor with a small leakage current and a high on/off ratio as the sensing transistor.

Referring to FIG. 19, the pixel PX is different from the embodiment of FIG. 18 at least in including a capacitor RC. The capacitor RC and the light-emitting diode element LD are electrically connected in parallel between the driving voltage line DVL (having the driving voltage ELVDD) and the common voltage line CVL (having the common voltage ELVSS). One electrode of the capacitor RC is connected to the anode of the light-emitting diode element LD, and the other electrode of the capacitor RC is connected to the cathode of the light-emitting diode element LD. This capacitor RC may enhance the ability to maintain the anode voltage.

While example embodiments have been described, practical embodiments are not limited to the described embodiments. Practical embodiments are intended to cover various modifications and equivalent arrangements within the scope of the appended claims.

What is claimed is:

1. A display device comprising:

a substrate;

a driving transistor including a first semiconductor layer and a first gate electrode, the first semiconductor layer including an oxide semiconductor material, and the first gate electrode disposed between the substrate and the first semiconductor layer;

a switching transistor electrically connected to the driving transistor and including a second semiconductor layer and a second gate electrode, the second semiconductor layer including an oxide semiconductor material and disposed between the substrate and the second gate electrode; and an emission control transistor electrically connected to the driving transistor and including a third semiconductor layer and a third gate electrode, the third semiconductor layer including polysilicon and disposed between the substrate and the third gate electrode, wherein the first semiconductor layer is disposed on a different layer from the third semiconductor layer.

2. The display device of claim 1, further comprising:

a driving voltage line configured to transmit a driving voltage, wherein the emission control transistor is electrically connected between the driving transistor and the driving voltage line.

3. The display device of claim 1, further comprising:

a light-emitting diode electrically connected to the emission control transistor, wherein the emission control transistor is electrically connected between the driving transistor and the light-emitting diode.

4. The display device of claim 1, wherein the driving transistor includes a first source electrode and a first drain electrode, the switching transistor includes a second source electrode and a second drain electrode, and the emission control transistor includes a third source electrode and a third drain electrode, the display device further comprises a first connector connected to one of the first source electrode and the first drain electrode, a second connector connected to one of the second source electrode and the second drain electrode, and a third connector connected to one of the third source electrode and the third drain electrode, and the first connector, the second connector, and the third connector are formed as a same layer.

5. The display device of claim 1, further comprising:

a capacitor electrode disposed between the substrate and the first gate electrode, wherein the first gate electrode overlaps the capacitor electrode, and wherein the third gate electrode and the capacitor electrode are formed as a same layer.

6. The display device of claim 1, further comprising:

a data line configured to transmit a data signal; and an emission control line configured to transmit an emission control signal, wherein the switching transistor is electrically connected to the data line, and wherein the emission control transistor is electrically connected to the emission control line.

7. The display device of claim 6, further comprising:

a light-emitting diode electrically connected to one of the driving transistor and the emission control transistor.

8. The display device of claim 1, further comprising:

a first insulating layer disposed on the substrate;

a second insulating layer disposed on the first insulating layer;

a third insulating layer disposed on the second insulating layer;

a fourth insulating layer disposed on the third insulating layer;

a first connector connected to the driving transistor through a contact hole formed in the fourth insulating layer;

a second connector connected to the switching transistor through a contact hole formed in the fourth insulating layer; and a third connector connected to the emission control transistor through a contact hole formed in the first, second, third, and fourth insulating layers.

9. The display device of claim 8, wherein the first semiconductor layer and the second semiconductor layer are formed as a same layer.

10. The display device of claim 8, further comprising a fifth insulating layer disposed on the fourth insulating layer;

a pixel electrode disposed on the fifth insulating layer and connected to the first connector through a contact hole formed in the fifth insulating layer.

11. A display device comprising:

a substrate;

a driving transistor including a first semiconductor layer and a first gate electrode, the first semiconductor layer including an oxide semiconductor material, and the first gate electrode disposed between the substrate and the first semiconductor layer;

a switching transistor electrically connected to the driving transistor and including a second semiconductor layer and a second gate electrode, the second semiconductor layer including an oxide semiconductor material and disposed between the substrate and the second gate electrode;

an emission control transistor electrically connected to the driving transistor and including a third semiconductor layer and a third gate electrode, the third semiconductor layer including polysilicon and disposed between the substrate and the third gate electrode; and a light blocking layer disposed between the substrate and the second semiconductor layer, wherein the second semiconductor layer overlaps the light blocking layer, and wherein the first gate electrode and the light blocking layer are formed as a same layer.

12. A display device comprising:

a substrate;

a driving transistor including a first semiconductor layer and a first gate electrode, the first semiconductor layer including an oxide semiconductor material, and the first gate electrode disposed between the substrate and the first semiconductor layer;

a switching transistor electrically connected to the driving transistor and including a second semiconductor layer and a second gate electrode, the second semiconductor layer including an oxide semiconductor material and disposed between the substrate and the second gate electrode;

an emission control transistor electrically connected to the driving transistor and including a third semiconductor layer and a third gate electrode, the third semiconductor layer including polysilicon and disposed between the substrate and the third gate electrode;

a first insulating layer disposed on the substrate;

a second insulating layer disposed on the first insulating layer;

a third insulating layer disposed on the second insulating layer; and a fourth insulating layer disposed on the third insulating layer, wherein the first gate electrode is disposed between the second insulating layer and the third insulating layer, and wherein the second gate electrode is disposed between the third insulating layer and the fourth insulating layer.

13. The display device of claim 12, wherein the third gate electrode is disposed between the first insulating layer and the second insulating layer.

14. The display device of claim 12, wherein the first semiconductor layer is disposed between the third insulating layer and the fourth insulating layer, the second semiconductor layer is disposed between the third insulating layer and the fourth insulating layer, and the third semiconductor layer is disposed between the first insulating layer and the substrate.

15. The display device of claim 14, wherein the first semiconductor layer and the second semiconductor layer are formed as a same layer.

16. The display device of claim 14, further comprising:

an insulator disposed between the second semiconductor layer and the second gate electrode and between the third insulating layer and the fourth insulating layer.

17. The display device of claim 15, wherein the driving transistor further includes a first source electrode and a first drain electrode contacting the first semiconductor layer, and the first source electrode, the first drain electrode, and the second gate electrode are formed as a same layer.

* * * * *